(12) United States Patent
Fusegawa et al.

(10) Patent No.: US 6,893,499 B2
(45) Date of Patent: May 17, 2005

(54) SILICON SINGLE CRYSTAL WAFER AND METHOD FOR MANUFACTURING THE SAME

(75) Inventors: Izumi Fusegawa, Fukushima (JP); Koji Kitagawa, Fukushima (JP); Ryoji Hoshi, Fukushima (JP); Masahiro Sakurada, Fukushima (JP); Tomohiko Ohta, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 55 days.

(21) Appl. No.: 10/312,921

(22) PCT Filed: Jun. 28, 2001

(86) PCT No.: PCT/JP01/05565

§ 371 (c)(1),
(2), (4) Date: Dec. 26, 2002

(87) PCT Pub. No.: WO02/02852

PCT Pub. Date: Jan. 10, 2002

(65) Prior Publication Data

US 2003/0106484 A1 Jun. 12, 2003

(30) Foreign Application Priority Data

Jun. 30, 2000 (JP) ........................................ 2000-199226

(51) Int. Cl.⁷ ............................................. C30B 15/20
(52) U.S. Cl. .............................. 117/13; 117/19; 117/20; 117/30; 117/32
(58) Field of Search ............................. 117/13, 19, 20, 117/30, 32

(56) References Cited

FOREIGN PATENT DOCUMENTS

| JP | 04-192345 | 7/1992 |
|----|-----------|--------|
| JP | 06-056588 | 3/1994 |
| JP | 07-257991 | 10/1995 |
| JP | 08-330316 | 12/1996 |
| JP | 08-337490 | 12/1996 |
| JP | 11-079889 | 3/1999 |
| JP | 2000-272992 | 10/2000 |
| JP | 2000-351690 | 12/2000 |

OTHER PUBLICATIONS

F. Dupret et al., "Global modelling of Heat transfer in Crystal Growth Furnaces", Int., J. Heat Mass Transfer, vol. 33, No. 9, pp. 1849–1871, 1990.

Shinsuke Sadamitsu et al., "Dependence of the Growth-in Defect Distribution on Growth Rates in Czochralski Silicon", Jpn. J. Appl. Phys. vol. 32, (1993) pp. 3675–3681, Part 1, No. 9A, Sep. 1993.

(Continued)

*Primary Examiner*—Felisa Hiteshew
(74) *Attorney, Agent, or Firm*—Hogan & Hartson, LLP

(57) ABSTRACT

According to the present invention, there is disclosed a silicon single crystal wafer grown according to the CZ method which is a wafer having a diameter of 200 mm or more produced from a single crystal grown at a growth rate of 0.5 mm/min or more without doping except for a dopant for controlling resistance, wherein neither an octahedral void defect due to vacancies nor a dislocation cluster due to interstitial silicons exists as a grown-in defect, and a method for producing it. There can be provided a high quality silicon single crystal wafer having a large diameter wherein a silicon single crystal in which both of octahedral void defects and dislocation clusters which are growth defects are substantially eliminated is grown at higher rate compared with the conventional method by the usual CZ method, and furthermore by controlling a concentrations of interstitial oxygen in the crystal to be low, a precipitation amount is lowered and ununiformity of BMD in a plane of the wafer is improved, and provided a method for producing it.

11 Claims, 3 Drawing Sheets

OTHER PUBLICATIONS

Takemi Ueki et al., "Analysis of Side–Wall Structure of Grown–in Twin–Type Octahedral Defects in Czochralski Silicon", Jpn J. Appl. Phys. vol. 37, (1998) pp. 1667–1670.

Takeno et al., Evaluation of Microdefects in As–Grown Silicon Crystal, Mat. Res. Soc. Symp. Proc. Vo. 262, 1992.

V V Voronkov, "The Mechanism of Swirl Defects Formation in Silicon", Journal of Crystal Growth 59, 1982. pp. 625–643.

Masataka Hourai et al "Control of Growth–in Defects in Si Crystal Growth", Sumitomo Metal Industries, Ltd. vol. 25, No. 5, 1998.

SILICON SINGLE CRYSTAL WAFER AND METHOD FOR MANUFACTURING THE SAME

TECHNICAL FIELD

The present invention relates to a method for producing a silicon single crystal according to Czochralski method (hereinafter referred to as CZ method) used for fabrication of a semiconductor device, and a silicon single crystal wafer in which high yield can be obtained when a semiconductor device is fabricated. More specifically, it relates to a method for producing a silicon wafer wherein even if a silicon single crystal has a large diameter of 200 mm or more, few grown-in defects (hereinafter occasionally referred to as a growth defect) are introduced while the silicon single crystal is grown, and a silicon wafer with significantly high quality can be produced in high productivity by controlling a concentration of interstitial oxygen in a silicon single crystal to be low, as well as to a high quality silicon wafer with a large diameter.

BACKGROUND TECHNOLOGY

As a method of producing a silicon single crystal used for fabrication of a semiconductor device, CZ method wherein a single crystal is pulled from a melt in a quartz crucible with growing the single crystal has been widely conducted. In a CZ method, a seed crystal is immersed in a silicon melt in a quartz crucible in an atmosphere of inert gas, and then a predetermined silicon single crystal is grown by pulling the crystal with rotating the quartz crucible and the seed crystal.

In recent years, the demand to a silicon single crystal wafer has been severer with a tendency of a semiconductor device to be highly integrated and fine. Especially, influence of grown-in defects of a crystal in a device process has been pointed out recently, and various methods for improvement have been proposed.

Generally, in a silicon single crystal, there exist two kinds of internal (Intrinsic) point defects which are vacancies (Vacancy) and interstitial silicon atoms (Interstitial Si), those are grown to observable secondary defects by history after crystal growth. Grown-in defects due to vacancies are called FPD (Flow Pattern Defect), COP (Crystal Originated Particle), LSTD (Laser Scattering Tomography Defect) or the like depending on an evaluation method. The actual condition thereof is considered to be an octahedral void-type defect which is an agglomeration of vacancies (Analysis of side-wall structure of grown-in twin-type octahedral defects in Czochralski silicon, Jpn. J. Appl. Phys. Vol. 37 (1998) p-p. 1667–1670).

On the other hand, the defects due to interstitial atoms are formed as an agglomeration of interstitial silicons, and are called a dislocation cluster, LEP (Large Etch Pit), or the like (Evaluation of microdefects in as-groun silicon crystals, Mat.Res.Soc.Symp.Proc.Vol. 262 (1992) p-p. 51–56).

The octahedral void defect affects characteristics such as a gate oxide dielectric breakdown voltage (GOI: Gate Oxide Integrity) of a semiconductor device, and the dislocation cluster affects adversely characteristics such as junction leakage.

It is shown that an amount of introduced growth defects as above depends on a temperature gradient of a crystal at a growth interface and a growth rate of a silicon single crystal (The mechanism of swirl defects formation in silicon, Journal of Crystal growth, 1982, p-p 625–643). As for a method for manufacture of the silicon single crystal having few defects using the above fact, it has been disclosed that a growth rate of a silicon single crystal should be lowered in Japanese patent application Laid-Open (kokai) NO. 6-56588, and that the crystal should be pulled at a rate not exceeding the maximum pulling rate of the single crystal almost proportional to the temperature gradient of the boundary area between the solid phase and the liquid phase of the silicon single crystal in Japanese patent application Laid-Open (kokai) NO. 7-257991. There has also been reported an improved CZ method which takes note of a temperature gradient (G) and a growth rate (V) during growing of a crystal (Journal of the Japanese Association for crystal Growth, vol. 25, No. 5, 1998).

In addition, with regard to each kind of defects, there have been proposed various method for controlling octahedral void defects, and they can be roughly classified to the following two methods. One of them is a method wherein a defect density is reduced by controlling a thermal history of a crystal (slow cooling) (for example, publication of Japanese Patent Application No. 7-143391), and the other is that Vacancy is controlled by controlling a temperature gradient of a crystal and a pulling rate (for example, Japanese patent application Laid-Open (kokai) NO. 7-257991 described above). Furthermore, it has also been proposed that a dislocation cluster is controlled by controlling a temperature gradient of a crystal and a pulling rate (for example, Japanese patent application Laid-Open (kokai) NO. 8-330316).

However, the method currently shown here, for example as disclosed in Japanese patent application Laid-Open (kokai) NO. 8-330316, relates to a wafer grown at a low rate wherein OSF (Oxidation induced Stacking Faults, which is generated in a ring shape on a surface when the crystal is processed into a wafer) is disappeared at the center of the crystal, and it is a technology in which significant lowering of productivity and significant increase of cost cannot be avoided.

In this regard, it will be explained below in more detail. Based on the conventional technology in which OSF did not disappear at growth rate of 0.5 mm/min or more, the above technology is achieved by lowering a temperature gradient by means of a structure in a furnace which hardly cools a crystal to eliminate a difference of a temperature gradient in a crystal axis direction between a center part and a peripheral part, or to reduce a temperature gradient at a peripheral part of the crystal (that is, cooling from the peripheral part of the crystal is reduced, and thereby the temperature gradient in a crystal axis direction is necessarily reduced, and thus a growth rate is further lowered). Accordingly, in such a method, that is, in a conventional technique, it is necessary to pull at a lower growth rate than 0.5 mm/min at which an OSF ring region disappears at a center, and thus significant increase of cost cannot be avoided. Especially, high quality wafers having a diameter of 200 mm or more is used predominantly at present, and a method for mass-producing the crystals by increasing a pulling rate has been required.

On the other hand, as a method for reducing octahedral void defects in the whole plane of the wafer at higher growth rate, in the method disclosed in Japanese patent application Laid-Open (kokai) NO. 7-257991, an OSF generating region is vanished at the crystal center by increasing the temperature gradient in a crystal axis direction in a solid-liquid interface, and thereby speeding-up of crystal pulling rate can be achieved. However, since it is achieved by making cooling from the peripheral part of the crystal as large as possible, a temperature gradient at the peripheral part is significantly large compared with that at the center part.

Accordingly, it can be easily assumed that dislocation clusters have been generated.

As described above, in order to produce the crystal in which both octahedral void defects and dislocation clusters disappear by conventional technique, there has been only a method with quite low productivity and high production cost wherein a rate of pulling the crystal is made lower than 0.5 mm/min, which cannot be put into practical use on commercial purpose. The low productivity is a large problem especially in mass-production of a crystal with a large diameter.

Furthermore, when using a gas flow-guide cylinder arranged around a silicon single crystal in such a production method, since it is necessary to increase a distance between the gas flow-guide cylinder and a surface of a melt to some extent in order to obtain-a uniform temperature gradient on a plane vertical to a growth axis of a single crystal, inert gas does not reach near the surface of the melt, and thus the evaporation effect of the oxygen atom from the surface of the melt by inert gas is reduced extremely. As a result, concentration of the interstitial oxygen in the produced silicon single crystal will become higher. Moreover, also in the case that the gas flow-guide cylinder is not used, the effect of evaporating oxygen atoms from the surface of the melt cannot be expected, and thus there is a problem that the silicon single crystal having a low concentration of interstitial oxygen cannot be obtained.

Moreover, if a silicon wafer manufactured from such a silicon single crystal having high interstitial oxygen concentration is subjected to heat treatment, for example, at high temperature of 1150° C. in an oxidizing atmosphere for about 2 hours, OSF may be formed as a defect induced by oxidation heat treatment in some cases. When the OSF is formed in a region where a device is to be fabricated, electrically serious failures such as leakage will be generated.

Furthermore, there is disclosed in Japanese patent application Laid-Open (kokai) NO. 11-79889 the silicon wafer with high quality wherein there is no generation of octahedral void-type defect which is an agglomeration of vacancies nor dislocation cluster-type defect formed as an agglomeration of interstitial silicons as a result of adjusting growth conditions. However, even in a region free from each of defects, there exist the region having extremely different precipitation characteristics in a plane of the wafer in the case that it is subjected to the heat treatment at 800° C. for 4 hours and at 1,000° C. for 16 hours in dry oxygen atmosphere as a precipitation heat treatment for interstitial oxygen. The precipitation characteristics of the interstitial oxygen is, of course, an important quality characteristics of a silicon wafer, since it has a close relation with a density of BMD (Bulk Micro Defect) formed during a fabrication process of a semiconductor device, and BMD becomes a gettering source for heavy metal impurities, or becomes a cause of a warp or slip of the wafer in the case that it is formed ununiformly.

As described above, since the rate of crystal growth is lowered in the case that the silicon single crystal with quite few growth defects is to be manufactured, it is not only inferior with respect to efficiency of industry, but there are problems in quality as for a wafer produced from this silicon single crystal that OSF is generated, and that a warp of the wafer and slip dislocations due to thermal strain may be generated by ununiform BMD density which is formed by precipitation of interstitial oxygen concentration in the plane of the wafer.

DISCLOSURE OF THE INVENTION

The present invention has been made in order to solve the above-mentioned conventional problems. The object of the present invention is to grow at higher rate compared with the conventional method a silicon single crystal having a diameter of 200 mm or more wherein both of octahedral void defects and dislocation clusters which are growth defects are substantially eliminated. Further object is to produce a silicon single crystal with significantly high quality wherein by controlling a concentrations of interstitial oxygen in the crystal to be low, an amount of precipitated interstitial oxygen atoms in a silicon single crystal is lowered and uniformity of BMD in a plane of the wafer is improved, industrially at low cost while maintaining high productivity and high yield.

To achieve the above-mentioned object, the silicon single crystal wafer according to the present invention is a silicon single crystal wafer grown according to the Czochralski method which is a wafer having a diameter of 200 mm or more produced from a single crystal grown at a growth rate of 0.5 mm/min or more without doping except for a dopant for controlling resistance, wherein neither an octahedral void defect due to vacancies nor a dislocation cluster due to interstitial silicons exists as a grown-in defect.

As described above, by growing a defect-free silicon single crystal at a growth rate of 0.5 mm/min or more which was impossible in the usual CZ method without doping except for a dopant for controlling resistance, a substantially defect-free silicon single crystal wafer having a large diameter wherein neither the octahedral void defect due to vacancies nor the dislocation cluster due to interstitial silicons exist, and a defect which affects device characteristics does not exist can be provided at low cost.

In this case, concentration of interstitial oxygen in a silicon single crystal wafer is preferably $6 \times 10^{17}$ to $10 \times 10^{17}$ atoms/cm$^3$.

This is because, if it is more than $10 \times 10^{17}$ atoms/cm$^3$ (ASTM'79), BMD may be formed ununiformly, and there may be generated a warp of a wafer and slip dislocations due to thermal strain, for example when the wafer is subjected to heat treatment. Moreover, if it is $6 \times 10^{17}$ atoms/cm$^3$ or more, a proper quantity of BMD is surely generated, which is a proper amount as a source of gettering of heavy metals in a device process.

A method for producing a silicon single crystal according to the present invention is a method for pulling a silicon single crystal having a diameter of 200 mm or more by the Czochralski method wherein a pulling rate of the crystal is 0.5 mm/min or more, and the pulling is performed so that a temperature gradient in a crystal axis direction at a center of the crystal is high enough not to generate octahedral void defects and a temperature gradient in a crystal axis direction at 20 mm from a periphery of the crystal is low enough not to generate dislocation clusters. In this case, the above-mentioned temperature gradient in the crystal axis direction is preferably achieved by a structure in a furnace of an apparatus for pulling a single crystal.

As described above, if the crystal is pulled with controlling the temperature gradient in the axial direction at the center of the crystal and the temperature gradient in the axial direction at the periphery of the crystal to be in the region at which defects are not generated, it is possible to grow a substantially defect-free silicon single crystal with a large diameter at a high rate of 0.5 mm/min or more, which conventionally could be achieved only by a method of doping nitrogen, and thus a defect-free wafer can be produced at high productivity and high yield.

In the above-mentioned method for producing, the structure in a furnace can be such that at least a cylindrical gas flow-guide cylinder which surrounds single crystal to be grown is equipped, the upper end of the gas flow-guide cylinder is fixed to a water-cooled part of a chamber, a heat insulating material or a reflective material is provided at the downward end thereof so that it faces a silicon melt, and it is possible to set a gap between the heat insulating material or the reflective material and the surface of the melt to be 40 to 70 mm.

If the structure in a furnace is constituted in this way, the temperature gradient at the center and the periphery of the crystal in the solid-liquid interface of the above-mentioned single crystal can be controlled in a suitable range, and thus the defect-free single crystal can be grown at high rate of 0.5 mm/min or more, even if it is a crystal having a large diameter such as 200 mm or more.

Moreover, in the above-mentioned method for production, when a crystal is grown by the Czochralski method, it is preferable to apply a magnetic field of 3000 G or higher to a part near a solid-liquid interface, and the magnetic field to be applied can be a horizontal magnetic field or a cusp magnetic field.

As described above, if the horizontal magnetic field or the cusp magnetic field of 3000 G or more is applied to a part near a solid-liquid interface to control the convection of the melt, the temperature gradient of the crystal is further stabilized, the crystal quality becomes uniform, and which may lead to improvement in the yield.

The silicon wafer having a large diameter produced by the method of the present invention as described above is a substantially defect-free silicon wafer wherein neither the octahedral void defect due to vacancies nor the dislocation cluster due to interstitial silicons exists, and a defect which affects device characteristics does not exist. Moreover, it is a high quality silicon wafer wherein the concentration of interstitial oxygen in the crystal is controlled to be a low value.

As explained above, according to the present invention, growing of the crystal at a higher rate compared with a conventional method can be achieved by providing the gas flow-guide cylinder immediately above the silicon melt which arranges a heat insulating material or a reflective material at the lower end of the cylinder surrounding the single crystal to be grown, and controlling the temperature gradient at the center of the crystal and the temperature gradient at the periphery of the crystal in a crystal axis direction to be a suitable value. Accordingly, even if it is a silicon single crystal wafer having a large diameter, a substantially defect-free silicon single crystal wafer wherein void type defects, OSFs and dislocation clusters are eliminated can be produced at significantly high productivity, high yield, and low cost.

Furthermore, the concentration of interstitial oxygen in a silicon single crystal wafer is $6 \times 10^{17}$ to $10 \times 10^{17}$ atoms/cm$^3$ (ASTM'79), and a high quality silicon single crystal wafer having a large diameter wherein no OSF is generated during heat treatment process in production of a semiconductor device and an ununiform distribution of micro oxide precipitates (BMD) due to precipitation of the interstitial oxygen atoms in a plane of the wafer is improved can be produced at low cost.

(a) A conventional method, (b) the method of the present invention.

Figure 5:
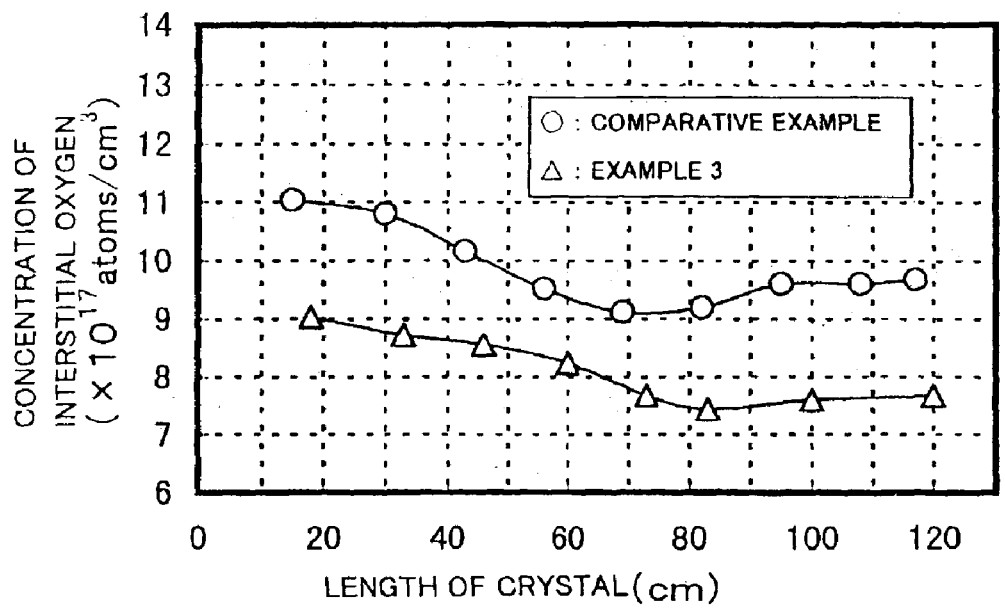

FIG. 5 is a graph of a result showing a distribution in a growth direction with regard to concentration of interstitial oxygen in a crystal.

Figure 6:
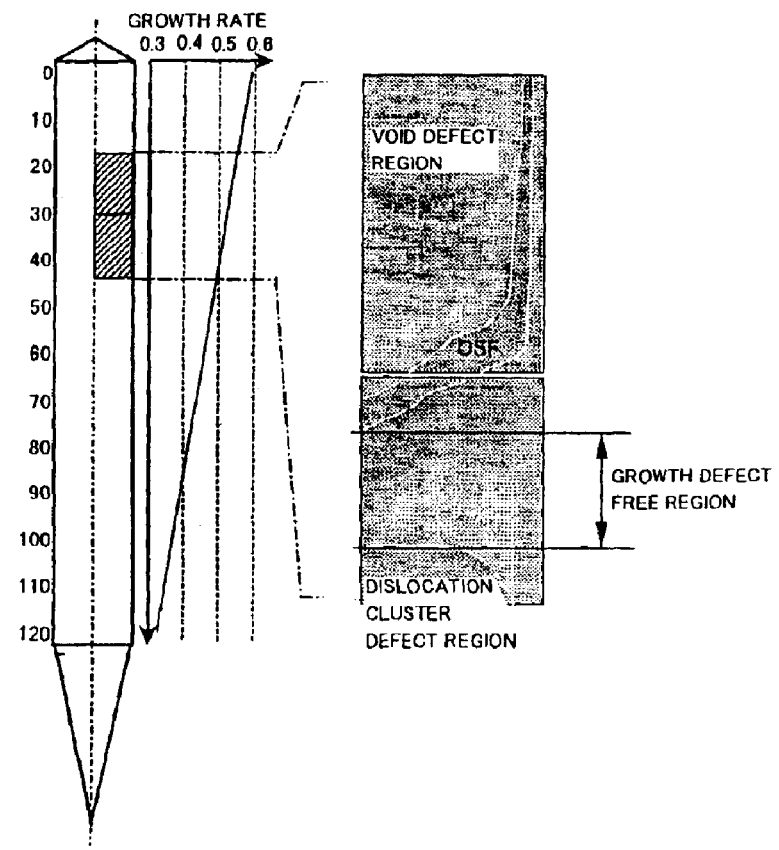

FIG. 6 is an explanatory view showing a defect distribution including a region which does not contain growth defects according to the present invention.

BEST MODE FOR CARRYING OUT THE INVENTION

The present invention will now be described in detail, but the present invention is not limited thereto. First, terms appearing herein will be described.

1) As for FPD (Flow Pattern Defect), pits and a ripple pattern are generated by slicing a wafer from a grown silicon single crystal ingot, removing a damaged layer of the surface through etching with a mixed solution of hydrofluoric acid and nitric acid, and then subjecting the surface to etching with a mixed solution of $K_2Cr_2O_7$, hydrofluoric acid, and water without agitation (Secco etching). This ripple pattern is referred to as FPD. As a density of FPDs in a plane of the wafer increases, failure with regard to dielectric breakdown strength of oxide film increases (Japanese patent Laid-Open (kokai) No. 4-192345).

2) As for SEPD (Secco Etch Pit Defect), when Secco-etching is performed in the same manner as in the case of FPD, defects which involve a flow pattern are referred to as FPD, and defects which involve no flow pattern are referred to as SEPD. In this SEPD, it is considered that large SEPD having a size of 10 $\mu$m or more (LSEPD) is caused by dislocation clusters. When dislocation clusters are present in a device, a current leaks through the dislocation, consequently the function as a P-N junction is not served.

3) As for LSTD (Laser Scattering Tomography Defect), a wafer is sliced from a grown silicon single crystal ingot, a damaged layer of the surface is removed through etching with a mixed solution of hydrofluoric acid and nitric acid, and then the wafer is cleaved. When infrared light is introduced into the wafer through the cleavage plane, a scattering light due to the defects existing in the wafer can be detected by detecting light come out from the wafer surface. A scattering defect detected in this observation has already been reported at an academic conference or the like, and it is considered to be an oxide precipitate (see J. J. A. P. Vol. 32, P3679, 1993). According to recent researches, it has been reported to be an octahedral void.

4) COP (Crystal Originated Particle) is a defect that leads to a degradation of the dielectric breakdown strength of oxide film at a central portion of a wafer. The defect which appears as FPD in the case of Secco etching appears as COP by SC-1 cleaning (cleaning by using a mixed aqueous solution of $NH_4OH:H_2O_2:H_2O=1:1:10$) which serves as a preferential etchant. The pit has a diameter of 1 μm or less, and it is examined by a light scattering method.

5) L/D (Large Dislocation: simplified expression of interstitial dislocation loop) contains LSEPD, LFPD and the like, and it is a defect considered to be generated due to dislocation loops. As described above, LSEPD is SEPD having a size not less than 10 μm. LFPD is FPD whose tip end pit has a size not less than 10 μm, and it is also considered to be generated due to dislocation loops.

Although various values are disclosed as for a ratio of a temperature gradient G immediately above the solid-liquid interface of a crystal and a growth rate V, which is an important index for obtaining a low defect crystal relating to growing of a single crystal of the present invention, various values are proposed until now, and they are not unified. For example, it is $13\times10^4$ $cm^2/K$ in Japanese patent application Laid-Open (kokai) NO. 7-257991, and the value is 0.22 $mm^2/°C.·min$ in a temperature gradient from a melting point to 1300° C. in Japanese patent application Laid-Open (kokai) NO. 8-330316. The above-mentioned values cannot be obtained exactly, since there is no highly precise thermometry means in a furnace of the apparatus for pulling crystal. Therefore, a thermal simulation by a computer has performed. However, the actual methods therefor are different from each other, and various results are obtained depending on a boundary condition and a different physical data given by each of researchers. Therefore, even if a certain specific value is defined, the reliability of the value itself is very scarce.

In view of the above-mentioned circumstance, the inventors of the present invention have first prepared several kinds of structures in a furnace which is assumed to have an influence on the temperature gradient near the interface, pulled a crystal using each structure in a furnace with reducing a pulling rate gradually depending on a length of pulling, and experimentally obtained the pulling rate at which OSF disappears at the center of the crystal as for a single crystal with a diameter of 200 mm. In this experiment, in order to keep influence of the melt convection to a minimum, pulling was performed by the MCZ method in which a horizontal magnetic field is applied. In this occasion, a pulling rate was set at V1, V2 . . . Vn. Furthermore, the thermal simulation by the computer is performed as for these structures in a furnace, a temperature gradient in axial direction from the melting point (1420° C.) of the silicon to 1400° C. immediately above the solid-liquid interface at the center of the crystal is obtained to be set at G1, G2 . . . Gn. The value V/G was calculated from these results and found to be 0.231 $mm^2/°C.·min$. However, as mentioned above, this value is nothing but a referential value, and hard to be accepted as a true physical value.

In the above-mentioned calculation, the value of G was calculated at each point in every 10 mm in the direction of a plane of a crystal as well as G. Consequently, although there were some variations, as the value of G increased, ΔG (difference in a, temperature-gradient in axial direction between the center and the periphery of the crystal) also increased. On the contrary, if ΔG was made smaller, G was also smaller.

As described above, it is necessary to raise a pulling rate of the crystal V in order to produce a low-defect wafer with high productivity. However since the crystal pulled by the Czochralski method is cooled by radiating heat from the periphery of the crystal in the cooling process from a melting point. Therefore, reducing defects, that is, reducing a temperature-gradient difference in axial direction between the center and the periphery of the crystal (ΔG) is usually contrary to increasing a pulling rate, that is, increasing a temperature-gradient (G) in axial direction at the center of the crystal. This tendency is significant especially in the case of the crystal having a large diameter compared to the crystal with a small diameter, since heat in the crystal is more hardly radiated to the outside as the larger diameter of the crystal. Accordingly, they cannot be satisfied at the same time in growing of a silicon single crystal having a large diameter.

The pulled crystal was cut in an axial direction to provide a sample having a thickness of 2 mm, then octahedral void defects and pits with 10 μm or more were detected as FPD and a dislocation cluster (LEPD) respectively by observation with an optical microscope after Secco-etching without agitation. There is an OSF ring region between the regions in which each defect is generated. The region where the OSF exists was subjected to oxidizing at 1100° C. for 60 minutes in a mixed atmosphere of oxygen and steam, and then a visual inspection was performed after the preferential etching and under collimated light to examine the distribution. As a result, it was confirmed that in the crystal pulled in these experiments, there was a region where neither an octahedral void defect nor a dislocation cluster is observed when it is pulled at a pulling rate in a certain range. When it is pulled at a pulling rate between the rate at which the FPD generation region is disappeared at the center and the rate at which the dislocation cluster is generated, it is possible to produce a single crystal wafer having no octahedral void defect nor dislocation cluster. However, the pulling rate was 0.42 mm/min in that case. It means that although it is varied depending on a diameter of a pulled crystal, productivity is significantly lowered compared to a pulling rate of 0.6–1.0 mm/min in the crystal having a diameter of 200 mm usually performed, and thus it cannot be applied to commercial production.

Although it is indispensable requirements to make ΔG small and make G large in order to raise a growth rate of crystal, the inventors of the present invention have studied in details as for the feature of the temperature distribution in a crystal under the conditions of the same G and slightly small ΔG compared to the above-mentioned relation of G-ΔG used for the experiment. As a result, it has been turned out that there is such a tendency in the structure in a furnace in which the radiant heat from a heater and a melt is supplied around a crystal at about 50 mm from a solid-liquid interface, and a ability of cooling a crystal is high in the upper part.

The inventors of the present invention have been studied further the relation between the distribution of defect generation and the temperature distribution of a crystal in detail. As a result, it has been found that both an octahedral void defect and a dislocation cluster are hardly generated at a crystal peripheral part of 20 mm from the periphery irrespective of the temperature gradient. It is presumed that it is caused by disappearing of a point defect in the surface of the crystal and out-diffusion accompanying it. Furthermore, it has been found that such a tendency is stronger in the case of a dislocation cluster, and the defect-free region can be easily obtained at the outside part of 20 mm from the periphery even if the temperature gradient is significantly large.

The inventors of the present invention have taken advantage of the knowledge that a temperature gradient at a most peripheral part of the crystal can be raised when the above-mentioned characteristics of temperature distribution further was emphasized, and studied in detail a crystal temperature distribution with the parts surrounding a crystal having a different shape (for example, gas flow-guide cylinder), a gap between them and the melt, a cooling cylinder and the like, and thereby completed the present invention.

Figure 2:
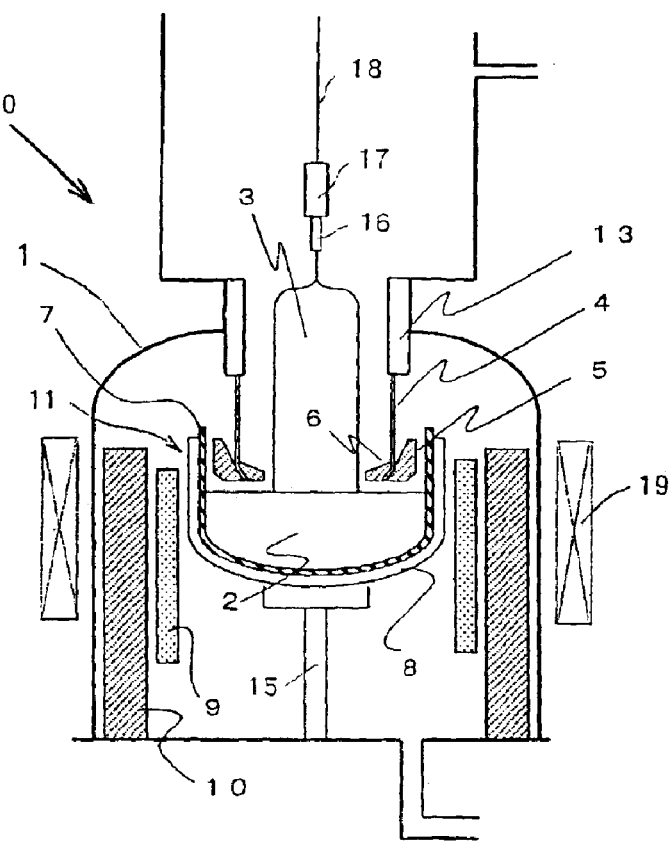
FIG. 2 is a schematic explanatory view showing an apparatus for pulling a single crystal by the CZ method used in the present invention.

That is, the target temperature distribution was able to be obtained by arranging the gas flow-guide cylinder 4 surrounding a crystal in a cylindrical shape or a shape reducing diameter toward a lower part, making it into the structure radiating the radiant heat from a crystal upward by connecting the upper part thereof to the water-cooled cylinder 13 and the like, and making a gap between the lower end of those parts and a melt into 40 to 70 mm, as shown in FIG. 2. Since $\Delta G$ will not become small enough if this gap is narrower than 40 mm, dislocation clusters are generated near a part of r/2 of the crystal at a pulling rate at which an octahedral void defect is vanished at the center. On the contrary, if the gap is too large, an octahedral void defect cannot be vanished at a pulling rate of 0.5 mm/min or more. Accordingly, the upper limit is preferable to be 70 mm. As a result of combining the above structures in a furnace and the suitable gap, even if it is a crystal having a diameter of 8 inches (200 mm), the crystal in which neither an octahedral void defect nor a dislocation cluster exists can be produced at a high rate of 0.5 mm/min or more. Furthermore, when a diameter of the crystal is 300 mm, even if the upper limit of a gap is set at 100 mm, an octahedral void defect can be vanished.

Furthermore, immediately above a gap with a melt 2, it is preferable to arrange a heat insulating material or a reflective material 6 which faces a crystal and a melt, and/or a heat insulating material or a reflective material 5 which faces a melt and a wall of a crucible. It is because the buffer zone of a temperature distribution is formed thereby between the heat dissipation preventive region from the circumference near the solid-liquid interface and a strong cooling zone at the upper part. As a result, only G was able to be increased still more efficiently without changing $\Delta G$.

Moreover, it is preferable to apply a horizontal magnetic field of 3000 G or more to the part near the solid-liquid interface. The reason is as follows. Generally, if a pulling rate is reduced, a shape of a solid-liquid interface will turn into a shape which hung down at a center of the crystal and $\Delta G$ will become large. However, by applying a magnetic field to the part near the solid-liquid interface, convection is suppressed and the shape is maintained as a good shape of upper convexity due to the influence of solidification latent heat. Because of the above effects, even if the temperature-gradient difference $\Delta G$ between the center and the periphery is small, the temperature at the periphery of the crystal can be made lower than at the center. That is, it has been turned out that $\Delta G$ can be constricted, even if G is made large relatively. By adding the buffer zone and applying the magnetic field, it is also possible to raise a pulling rate to 0.60 mm/min or more, and the degree of freedom of the structure in a furnace as for other quality items (for example, oxygen concentration controllability) and an operating condition to be modified for improvement of a success rate of making a single crystal is increased. Thereby, commercial production for practical use becomes easier. In addition, when the magnetic field to be applied is a cusp magnetic field, the same effect as the above can be obtained at 1000 G or higher.

The wafer obtained by slicing the silicon single crystal produced by the method for production of the present invention explained above has a large diameter, and it is a wafer produced from a single crystal grown at a growth rate of 0.5 mm/min or higher without doping except for the dopant for controlling resistance. Therefore, it is a wafer which is produced at low cost, and in which octahedral void defects due to vacancies and dislocation clusters due to interstitial silicon exist at quite low density, namely it is a substantially defect-free silicon single crystal wafer.

Next, the effect of controlling/reducing the concentration of interstitial oxygen according to the present invention will be explained.

Figure 3:
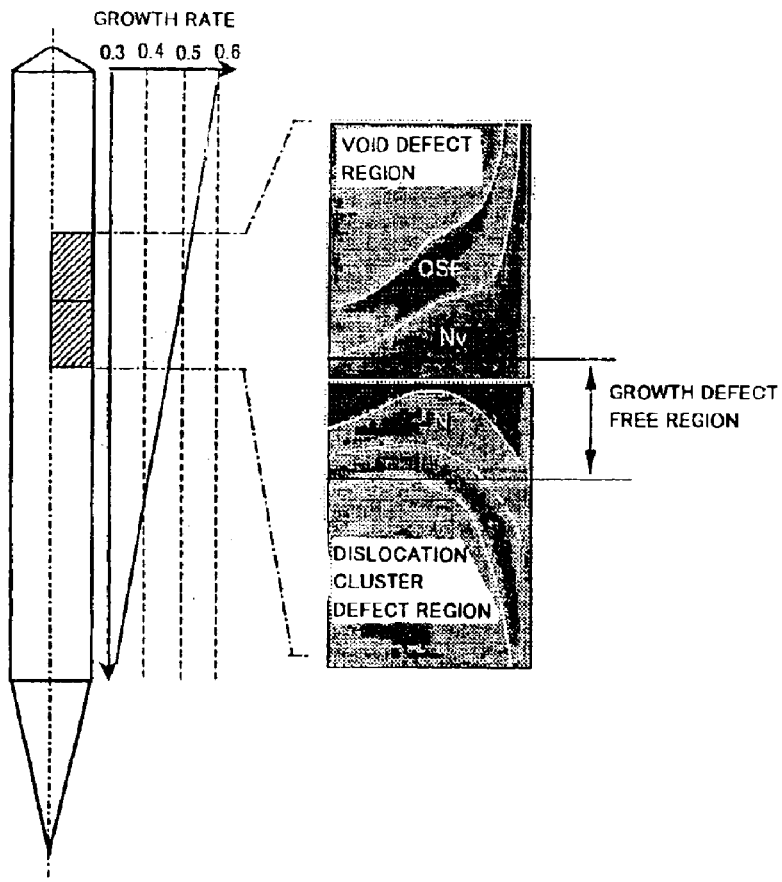
FIG. 3 is an explanatory view showing a defect distribution in a growth direction of the silicon single crystal with a high oxygen concentration which has a region of very few growth defects.

FIG. 3 shows a defect distribution in the crystal having relatively high oxygen concentration wherein concentration of interstitial oxygen of a silicon single crystal including a region containing no growth defect is $14.4 \times 10^{17}$ atoms/cm$^3$ (ASTM'79). The specific-resistance of the crystal was adjusted to 10 $\Omega$·cm with boron doping, and the silicon single crystal having a diameter of 8 inches (200 mm) of a crystal growth axis <100> was grown with gradually decreasing a growth rate of the crystal at the time of growing, so that various kinds of defect regions might appear.

The vertically cut wafer was taken by cutting a block of a grown silicon single crystal having a diameter of 8 inches in a parallel direction to a growth axis, subjected to heat treatment at 800° C. for 4 hour and 1000° C. for 16 hours as a heat treatment for precipitation of interstitial oxygen, and then mapping measurement of a lifetime was performed. A lifetime is time after a pair of electron-hole is generated by irradiating a pulsed light with high energy on a wafer until it returns to the original thermal equilibrium state by being recombined. In the case that defects such as BMD exist in a wafer, it works as a recombination center. As a result, the value of a lifetime is lowered, and the BMD distribution formed by precipitation of interstitial oxygen atoms can be evaluated.

As shown in FIG. 3, since interstitial oxygen is not precipitated in the region in which OSF is formed, BMD density is low and a lifetime is high. Moreover, it is clearly shown that there are the Nv region wherein many BMD generated by oxygen precipitation exist and the Ni region wherein few BMD exist in the growth defect-free region. As shown above, even if a crystal is produced with controlling a growth rate so that a growth defect-free region can be obtained, it may be a wafer wherein BMD is easily generated as precipitation characteristics of interstitial oxygen, a wafer wherein it is not formed, a wafer wherein BMD is low at the center of the wafer and a lot of BMD is generated at a periphery thereof and the like. Accordingly, there is a problem that a warp of the wafer or the like is caused during production process of a semiconductor device.

Then, according to the present invention, a silicon single crystal was grown using an apparatus for producing a silicon single crystal shown in FIG. 2. Using the apparatus for producing a silicon single crystal in which heat insulating materials 6 and 5 is provided outside and inside the gas flow-guide cylinder 4 arranged around a single crystal as shown in FIG. 2, 150 kg of polycrystal silicon was charged to a quartz crucible with a diameter of 600 mm, and then a graphite heater 9 of a resistance heating was electrified to melt polycrystal silicon and form a silicon melt. The specific resistance was adjusted to 10 $\Omega$·cm, the seed crystal with an orientation <100> was immersed into the silicon melt 2, and the silicon single crystal 3 with a diameter of 200 mm was grown through a necking process.

Figure 4:
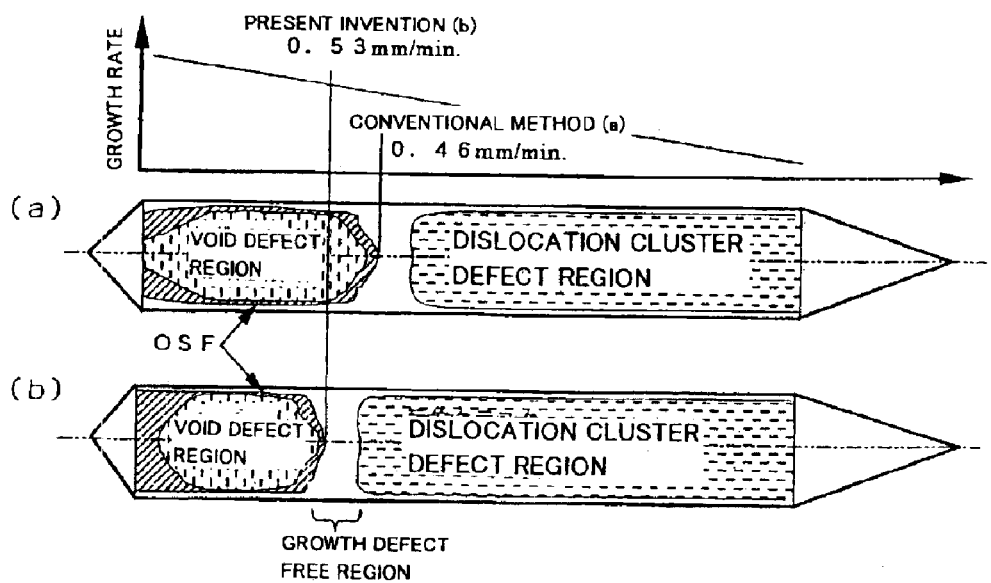
FIG. 4 is an explanatory drawing showing the relation between a growth rate of a crystal and a defect distribution including a region which does not contain growth defects in a crystal growth direction.

The rate of crystal growth was reduced gradually from the top side of a crystal so that various kinds of defects might be formed. The silicon single crystal wafer in the shape of a strip was produced by cutting the grown silicon single crystal vertically in parallel to a direction of growth, and subjected to the heat treatment at 800° C. for 4 hour and 1000° C. for 16 hours as a heat treatment for precipitation of interstitial oxygen, and then mapping measurement of a lifetime was performed. The defect distribution in the growth direction of the silicon single crystal grown by a conventional structure wherein a heat insulating material is not provided in the gas flow-guide cylinder is shown in FIG. 4(a). The defect distribution in the growth direction of the silicon single crystal grown according to a method for production of the present invention is shown in FIG. 4(b). It is shown in FIG. 4 that a rate of crystal growth at which OSF contracts and disappears at the center of the crystal according to the method of the present invention is from 0.46 to 0.53 mm/min, and it is increased about 10%. Thereby, it has been turned out that the productivity and yield of a single crystal wherein either an octahedral void defect or dislocation cluster due to interstitial silicon does not exist substantially can be improved significantly, and a production cost can be reduced.

The concentration of interstitial oxygen in the silicon single crystal manufactured by the pulling method of the present invention was controlled to be low, and it was 9–7.5×10$^{17}$ atoms/cm$^3$ (ASTM'79) in the range that a crystal length is 20 cm–120 cm from the top.

It is presumed the reason is promoting evaporation of oxygen atoms from the surface of the melt for that an inert gas flowed efficiently between the inner and outer heat insulating materials provided at a lower end on the melt side of the gas flow-guide cylinder and the surface of the melt, and suppressing melt convection by keeping temperature of the surface of the melt with a heat insulating material provided outside of the gas flow-guide cylinder. With regard to the above, for example, even when the size of a quartz crucible to be used is changed, the temperature gradient of the grown crystal can be set arbitrarily by determining the size of the heat insulating material inside of the gas flow-guide cylinder appropriately. Moreover, since it becomes possible to control the concentration of interstitial oxygen in the crystal by determining the size of the heat insulating material outside of a gas flow-guide cylinder appropriately, a defect-free silicon single crystal can be produced easily, irrespective of the size of the crucible.

As described above, concentration of the interstitial oxygen in a silicon single crystal wafer is preferably 6×10$^{17}$ to 10×10$^{17}$ atoms/cm$^3$ (ASTM'79) in the present invention.

If it is more than 10×10$^{17}$ atoms/cm$^3$, BMD may be formed ununiformly, and a warp of the wafer and a slip dislocation due to a thermal strain may be caused, for example, when the wafer is subjected to heat treatment. Moreover, if it is 6×10$^{17}$ atoms/cm$^3$ or more, uniformity of BMD is improved, and there is an advantage that an amount thereof is proper as a source of gettering for heavy metal in a device process.

Hereafter, the present invention will be explained further in detail, with referring the drawings.

First, FIG. 2 explains an example of constitution of the apparatus for pulling a single crystal by the CZ method used in the present invention. As shown in FIG. 2, the apparatus for pulling a single crystal 30 is constituted by a water-cooled chamber 1 used as a pulling chamber, a crucible 11 provided in the chamber 1, a heater 9 arranged around the crucible 11, a crucible holding shaft 15 for rotating the crucible 11 and a rotating mechanism therefor (not shown), a seed chuck 17 holding a silicon seed crystal 16, a wire 18 for pulling the seed chuck 17, and a winding mechanism (not shown) which rotates or winding the wire 18. As for the crucible 11, a quartz crucible 7 for accommodating a silicon melt (molten metal) 2 is provided inside, and a graphite crucible 8 is provided outside the quartz crucible. Further, heat insulating material 10 surrounds the outside of the heater 9.

Moreover, in order to set up the production conditions for the method for producing of the present invention, there is provided a gas flow-guide cylinder 4 which surrounds a crystal 3 in a cylindrical shape or a shape reducing a diameter toward lower part. The upper part thereof is connected to a water-cooled cylinder 13 which constitutes a part of the chamber (the water-cooled cylinder 13 is not formed in some cases), or it has a constitution that the diameter is enlarged toward upper part and a metal plate with a high reflectance such as molybdenum is used as a reflective material at least at the inside surface thereof, or a heat insulating material 6 is provided at the lower end of inside of the gas flow-guide cylinder 4 so that it may face the silicon melt to radiate the radiant heat of the crystal upward. Moreover, a heat insulating material 5 is provided at the lower end of outside of the gas flow-guide cylinder 4 so that it may face the silicon melt to keep a temperature of a surface of the melt. And, a gap between the lower end of these heat insulating materials and the melt is made controllable in the range of 40 mm to 70 mm, and thereby an intended temperature distribution of the crystal can be obtained.

Furthermore, a magnet 19 is provided outside of the pulling chamber 1 in a horizontal direction, and convection of the melt is suppressed by applying a horizontal magnetic field or a cusp magnetic field to the silicon melt 2, to achieve stable growth of a single crystal.

Next, a method for growing a single crystal using the above-mentioned apparatus for pulling a single crystal 30 will be described.

First, a polycrystal silicon raw material with high purity is heated to a temperature of a melting point (about 1420° C.) or more in the crucible 8 to be molten. Next, a tip of a seed crystal 16 is brought in contact with or immersed in the surface at almost center part of the melt 2 by winding back the wire 18. Then, while the crucible holding shaft 15 is rotated in a proper direction, a wire 18 is wound up with rotating to pull a seed crystal 17, and thereby growing of a single crystal is started. Thereafter, the single crystal ingot 3 in the shape of approximately column can be obtained by adjusting a pulling rate and a temperature appropriately.

In this case, in the present invention, in order to control the temperature gradient in a crystal, a distance of the gap between the heat insulating material or a reflective material 6 provided inside of the lower end of the above-mentioned gas flow-guide cylinder 4 or the heat insulating material or the reflective material 5 provided outside of the lower end of the gas flow-guide cylinder 4 and the surface of the silicon melt 2 is controlled, as shown in FIG. 2. Furthermore, if necessary, the water-cooled cylinder 13 for cooling a crystal is provided in the upper part of the gas flow-guide cylinder 4, the cooling gas is flown downward from the upper part, and thereby the crystal can be cooled.

In order to control the oxygen concentration in the crystal to be a predetermined value or less, in addition to installation of the above-mentioned gas flow-guide cylinder with a heat insulating material, there are controlled a rotation number of a crucible, a rotation number of a crystal, a flow rate of introduced gas, a pressure of atmosphere, and a strength and a direction of an applied magnetic field during pulling a crystal, and thereby it can be controlled precisely. For example, oxygen can be reduced to a predetermined value or less by lowering a rotation number of a crucible, increasing a gas flow rate, lowering a pressure, increasing a magnetic field.

Next, the obtained silicon single crystal ingot can be processed into a wafer of the present invention by subjecting it to slicing, chamfering, grinding, etching, and mirror-finish-polishing. Of course, a method for processing into a wafer is not limited thereto, and any method can be used as far as it is a method generally used.

The specific embodiment of the present invention will be explained below by examples, but the present invention is not limited thereto.

EXAMPLE 1

A silicon single crystal was grown using the apparatus for producing silicon single crystal shown in FIG. 2. The members in the furnace in this apparatus for growing crystal were designed by using global heat transfer analysis software called FEMAG (F. Dupret, P. Nicodeme, Y. Ryckmans, P. Wouters, and M. J. Crochet, Int. J. Heat Mass Transfer, 33, 1849 (1990)), in order to generate no octahedral void defect at a growth rate of 0.5 mm/min or more, and there was manufactured an apparatus for pulling a single crystal wherein there are provided a heat insulating material 5 outside and a heat insulating material 6 inside at the lower end of the gas flow-guide cylinder 4 arranged around a single crystal so that a gap between them and a surface of the silicon melt may be 55 mm (however, the water-cooled cylinder 13 of FIG. 2 is not provided), to obtain the temperature gradient of the center part of the crystal of 23.2° C./cm, and the temperature gradient of the peripheral part of the crystal of 22.91° C./cm during growing the crystal. 150 kg of polycrystal silicon was charged into a quartz crucible having a diameter of 600 mm, and the graphite heater 9 of a resistance heating is electrified to melt the polycrystal silicon and form the silicon melt 2. Then, boron was added to adjust a specific resistance to 10 Ω·cm, and the horizontal magnetic field of 4000 G was applied to the surface of the silicon melt. And then, the seed crystal with an orientation <100> was immersed in this silicon melt, and the silicon single crystal having a diameter of 200 mm was grown through the necking process. The growth rate of the crystal was gradually reduced from the top of the crystal so that various kinds of defects might be formed.

The silicon single crystal wafer in the shape of a strip was prepared by cutting vertically the grown silicon single crystal in parallel with a growth direction. In order to investigate formation conditions of octahedral void defects and dislocation clusters due to interstitial silicon, the wafer from which the damage generated during cutting was removed with a chemical polishing was subjected to a preferential etching for 30 minutes without agitation using Secco solution within a etching bath. The density of the flow pattern (FPD) accompanied by the ripple pattern was measured with an optical microscope. Moreover, in order to investigate an oxidation induced stacking fault, the wafer cut from adjacency of the silicon single crystal block was subjected to the heat treatment at 1150° C. for 100 minutes in wet-oxidizing atmosphere, and then generation distribution of OSF was investigated.

Figure 1:
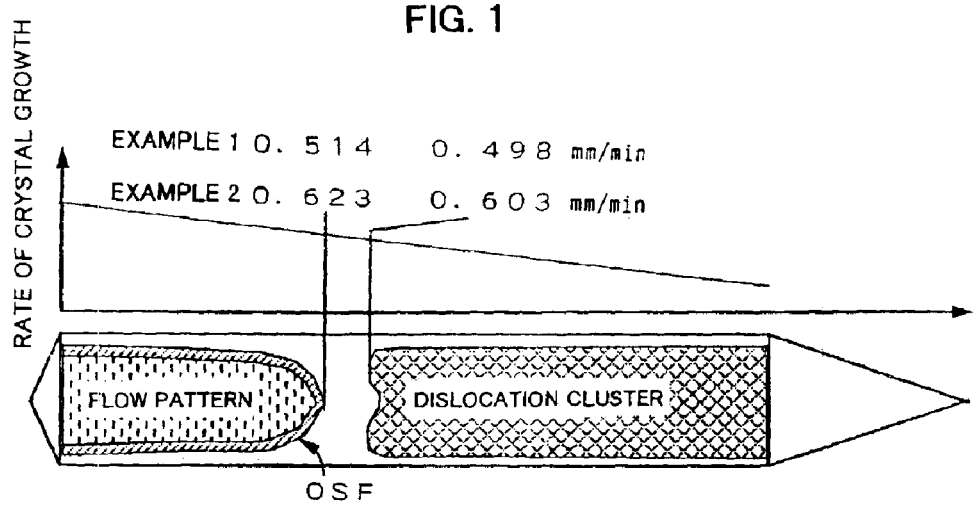
FIG. 1 is a view of a result showing the relation between a growth rate of a crystal and a defect distribution including a region which does not contain growth defects in a crystal growth direction in Examples.

The results of the formation conditions of the flow patterns, dislocation clusters, and OSFs in the direction of crystal growth were shown in FIG. 1. As shown in FIG. 1, the region of generating OSFs is formed in the U character shape, and disappeared at the center part of the crystal at a growth rate of a single crystal of 0.514 mm/min. The flow patterns which are octahedral void defects were formed in the higher rate side of inside the above OSF. The dislocation clusters were formed in the region of the crystal growth rate lower than 0.498 mm/min.

As mentioned above, the silicon single crystal in which neither an octahedral void defect nor a dislocation cluster is generated can be produced at low cost industrially by controlling the growth rate to be 0.50–0.51 mm/min.

EXAMPLE 2

A silicon single crystal was grown using the apparatus for producing a silicon single crystal shown in FIG. 2. In order not to generate an octahedral void defect when growing at higher rate compared with Example 1, there was designed and manufactured the apparatus for producing a single crystal wherein the water-cooled cylinder 13 which is formed so that a part of a chamber is projected in the furnace was added on the gas flow-guide cylinder 4 arranged around a single crystal as shown in FIG. 2, and there were provided a heat insulating material 5 outside and a heat insulating material 6 inside at the lower end of the gas flow-guide cylinder 4 so that a gap between them and a surface of the silicon melt may be 60 mm. When calculating temperature gradient of a crystal during growing with this apparatus for growing crystal according to global heat transfer analysis, it was 28.4° C./cm at the center part, and 29.9° C./cm at the peripheral part of the crystal. The growing conditions other than the above were the same as those in Example 1. The growth rate of crystal was gradually reduced from the top of the crystal so that various kinds of defects might be formed, to grow the silicon single crystal having a diameter of 200 mm.

Then, after treating it in the same way as Example 1, generation conditions of various defects were investigated.

The results of the formation conditions of the flow patterns, dislocation clusters, and OSFs in the direction of crystal growth were shown in FIG. 1. As shown in FIG. 1, the OSF region is formed in the U character shape, and disappeared at the center part of the crystal at a growth rate of a single crystal of 0.623 mm/min. The flow patterns which are octahedral void defects were formed in the higher rate side of inside the above OSF region. The dislocation clusters were formed in the region of the crystal growth rate lower than 0.603 mm/min. As mentioned above, the silicon single crystal in which neither an octahedral void defect nor a dislocation cluster is generated can be produced at low cost industrially by controlling the growth rate to be 0.61–0.62 mm/min.

EXAMPLE 3, COMPARATIVE EXAMPLE

The effect of reducing a concentration of interstitial oxygen in the silicon single crystal according to the method for production of the present invention was shown in FIG. 5.

As for the method for producing a silicon single crystal, as shown in Example 1, there were used the structure of the present invention wherein a heat insulating material 5 outside and a heat insulating material 6 inside of the gas flow-guide cylinder 4 arranged around a single crystal were provided so that a gap between them and a surface of the silicon melt may be 55 mm, and the structure for comparison wherein the heat insulating material 6 inside of the gas flow-guide cylinder was not provided. 150 kg of polycrystal silicon was charged into a quartz crucible having a diameter of 600 mm, and the graphite heater 9 of a resistance heating is electrified to melt the polycrystal silicon and form the silicon melt 2. Then, a specific resistance was adjusted to 10 Ω·cm, and the horizontal magnetic field of 4000 G was applied to the surface of the silicon melt. And then, the seed crystal with an orientation <100> was immersed in this silicon melt, and the silicon single crystal having a diameter of 200 mm was grown through the necking process.

A wafer having a thickness of about 2 mm was obtained from the arbitrary position in growing direction of the grown silicon single crystal vertically to a growing axis. Both sides of the wafer were chemically polished to prepare a mirror-polished wafer. Then, concentration of interstitial oxygen was measured by FT-IR (Fourier Transform Infrared Spectroscopy). It was turned out from FIG. 5 that the concentration of interstitial oxygen of the silicon single crystal produced by the method of the present invention was controlled to be low.

EXAMPLE 4

The uniformity of BMD in the region in which there is no growth defect of the silicon single crystal produced by the method for production of the present invention was shown in FIG. 6. It is a graph showing the results of the measurement for the lifetime of the wafer obtained by cutting vertically the crystal in a growth direction, and subjecting it to the heat treatment of 800° C. for 4 hour and 1,000° C. for 16 hours as a precipitation heat treatment of interstitial oxygen concentration. In the region which does not contain a growth defect, the degree of lowering of the lifetime is slight as shown in FIG. 6. Therefore, since the ununiformity of BMD to be formed is improved further, an ununiform BMD distribution is not formed even in the heat treatment of a semiconductor device fabrication process. Thereby, stable production without a risk of generation of a warp or a slip dislocation becomes possible.

The present invention is not limited to the above-described embodiment. The above-described embodiment is a mere example, and those having the substantially same structure as that described in the appended claims and providing the similar action and effects are included in the scope of the present invention.

For example, in the above-described embodiment, cases where the silicon single crystal having a diameter of 8 inches (200 mm) was grown were exemplified. However, the present invention is not limited thereto, and can be applied to a silicon single crystal having a diameter of 10 to 16 inches (250 to 400 mm) or more, as far as it is pulled so that a whole plane of the crystal may be substantially defect-free region, at a growth rate of 0.5 mm/min or more with controlling adequately a temperature gradient at the center of the crystal and a temperature gradient at the periphery in a crystal axis direction, using a gas flow-guide cylinder equipped with a heat insulating material.

What is claimed is:

1. A silicon single crystal wafer grown according to the Czochralski method which is a wafer having a diameter of 200 mm or more produced from a single crystal grown at a growth rate of 0.5 mm/min or more without doping except for a dopant for controlling resistance, wherein neither an octahedral void defect due to vacancies nor a dislocation cluster due to interstitial silicons exists as a grown-in defect.

2. The silicon single crystal wafer according to claim 1 wherein a concentration of interstitial oxygen in the silicon single crystal wafer is $6 \times 10^{17}$ to $10 \times 10^{17}$ atoms/cm$^3$.

3. A method for producing a silicon single crystal having a diameter of 200 mm or more by the Czochralski method wherein a pulling rate of the crystal is 0.5 mm/min or more, and the pulling is performed so that a temperature gradient in a crystal axis direction at a center of the crystal is high enough not to generate octahedral void defects and a temperature gradient in a crystal axis direction at 20 mm from a periphery of the crystal is low enough not to generate dislocation clusters.

4. The method for producing a silicon single crystal according to claim 3 wherein the temperature gradient in a crystal axis direction is achieved by a structure in a furnace of an apparatus for pulling a single crystal.

5. The method for producing a silicon single crystal according to claim 4 wherein the structure in a furnace is such that at least a cylindrical gas flow-guide cylinder which surrounds a single crystal to be grown is equipped, the upper end of the gas flow-guide cylinder is fixed to a water-cooled part of a chamber, a heat insulating material or a reflective material is provided at the downward end thereof so that it faces a silicon melt, and it is possible to set a gap between the heat insulating material or the reflective material and the surface of the melt to be 40 to 70 mm.

6. The method for producing a silicon single crystal according to claim 5 wherein when the crystal is grown by the Czochralski method, a magnetic field of 3000 G or more is applied to a part near a solid-liquid interface.

7. The method for producing a silicon single crystal according to claim 6 wherein the magnetic field to be applied is a horizontal magnetic field or a cusp magnetic field.

8. The method for producing a silicon single crystal according to claim 4 wherein when the crystal is grown by the Czochralski method, a magnetic field of 3000 G or more is applied to a part near a solid-liquid interface.

9. The method for producing a silicon single crystal according to claim 8 wherein the magnetic field to be applied is a horizontal magnetic field or a cusp magnetic field.

10. The method for producing a silicon single crystal according to claim 3 wherein when the crystal is grown by the Czochralski method, a magnetic field of 3000 G or more is applied to a part near a solid-liquid interface.

11. The method for producing a silicon single crystal according to claim 10 wherein the magnetic field to be applied is a horizontal magnetic field or a cusp magnetic field.

* * * * *